United States Patent [19]
Robertson

[11] Patent Number: 5,392,229
[45] Date of Patent: Feb. 21, 1995

[54] GRAPHICS PROCESSING APPARATUS WITH VIDEO MEMORY FOR STORING GRAPHICS DATA

[75] Inventor: Iain C. Robertson, Bedford, United Kingdom

[73] Assignee: Texas Instruments Incorporated, Dallas, Tex.

[21] Appl. No.: 675,392

[22] Filed: Mar. 26, 1991

Related U.S. Application Data

[62] Division of Ser. No. 387,266, Jul. 28, 1989, Pat. No. 5,060,244.

[51] Int. Cl.$^6$ .............................................. G06F 15/00
[52] U.S. Cl. ................................................ 364/715.09
[58] Field of Search ............... 395/162, 163, 164, 165, 395/166; 364/200 MS File, 900 MS File, 715.11, 715.09; 377/39, 54, 56, 76

[56] References Cited

U.S. PATENT DOCUMENTS

| | | | |
|---|---|---|---|
| 4,372,150 | 2/1983 | Stephens et al. | 73/40.5 R |
| 4,608,706 | 8/1986 | Chang et al. | 377/39 |
| 4,756,013 | 7/1988 | Van Veldhuizen | 377/39 |
| 4,780,895 | 10/1988 | Paul | 377/39 |
| 4,805,199 | 2/1989 | Muramatsu | 377/39 |
| 4,815,113 | 3/1989 | Ludwig et al. | 377/39 |
| 5,060,244 | 10/1991 | Robertson | 377/39 |
| 5,218,674 | 6/1993 | Peaslee et al. | 395/166 |
| 5,224,210 | 6/1993 | Pinedo et al. | 395/164 |

*Primary Examiner*—Phu K. Nguyen
*Attorney, Agent, or Firm*—William E. Hiller; Richard L. Donaldson

[57] ABSTRACT

In order to compare the total reached by a counter counting pulses from a source with a given number, the more significant digits from the counter are compared with the corresponding digits of the given number. The comparator produces an output when the groups of more significant digits are equal. An adjusted output taking account of the less significant digits of the given number is obtained by delaying the output by a time period equal to that required for the number of pulses from the source to be incremented by the number represented by the less significant digits of the given number. The time delay is provided by a multi-stage shift register using the pulses from the source as shift pulses, the output from the comparator being applied to the first stage and the adjusted output being derived from a stage selected according to the less significant digits of the given number.

10 Claims, 3 Drawing Sheets

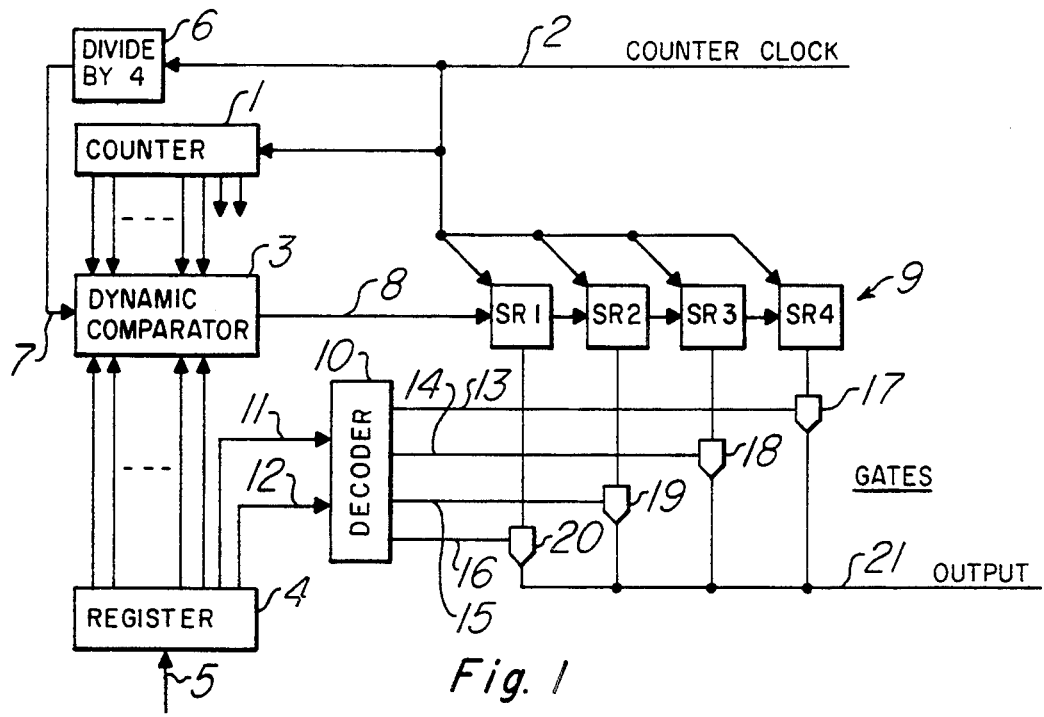
Fig. 1
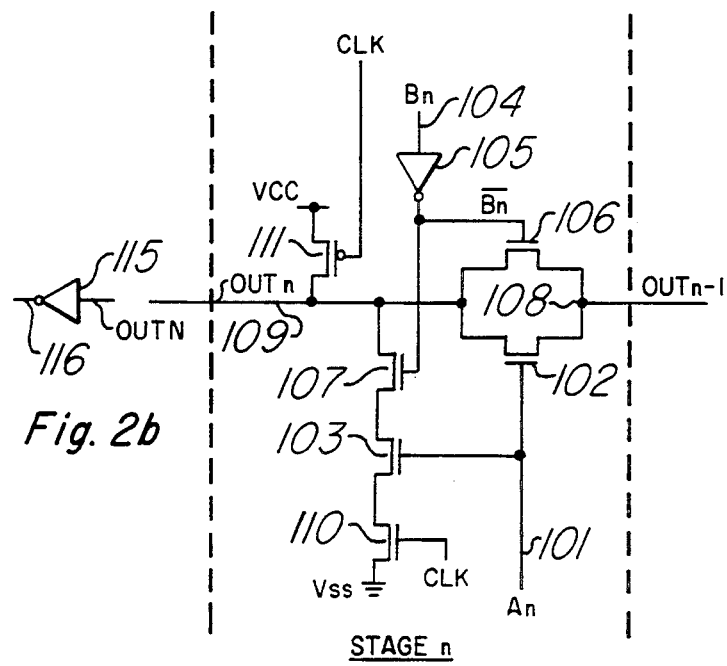
Fig. 2b
Fig. 2a
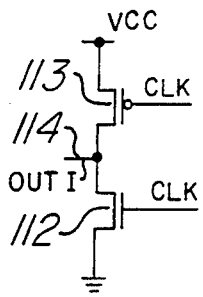
Fig. 2c

GRAPHICS PROCESSING APPARATUS WITH VIDEO MEMORY FOR STORING GRAPHICS DATA

This is a division of application Ser. No. 387,266, filed Jul. 28, 1989, now U.S. Pat. No. 5,060,244 issued Oct. 22, 1991.

CROSS REFERENCE TO RELATED APPLICATIONS

All of the following patent applications are cross-referenced to one another, and all have been assigned to Texas Instruments Incorporated. These applications have been concurrently filed and are hereby incorporated in this patent application by reference.

| Attorney Docket # | Serial # | Filing Date | Title |
|---|---|---|---|
| TI-13495 | 387,566 | 07/28/89 | Video Graphics Display Memory Swizzle Logic and Expansion Circuit and Method |
| TI-14258 | 387,567 | 07/28/89 | Video Graphics Display Memory Swizzle Logic Circuit and Method |
| TI-14356 | 387,459 | 07/28/89 | Graphics Floating Point Coprocessor Having Matrix Capabilities |
| TI-14309 | 387,242 | 07/28/89 | Graphics Processor Trapezoidal Fill Instruction Method and Apparatus |
| TI-14310 | 387,550 | 07/28/89 | Graphic Processor Three-Operand Pixel Transfer Method and Apparatus |
| TI-14311 | 387,119 | 07/28/89 | Graphics Processor Plane Mask Mode Method and Apparatus |
| TI-14312 | 386,936 | 07/28/89 | Dynamically Adaptable Memory Controller For Various Size Memories |
| TI-14313 | 387,472 | 07/28/89 | Graphics Processor Having a Floating Point Coprocessor |
| TI-14314 | 387,553 | 07/28/89 | Register Write Bit Protection Apparatus and Method |
| TI-14315 | 387,569 | 07/28/89 | Graphics Display Split-Serial Register System |
| TI-14316 | 387,455 | 07/28/89 | Multiprocessing Multiple Priority Bus Request Apparatus and Method |
| TI-14317 | 387,325 | 07/28/89 | Processing System Using Dynamic Selection of Big and Little Endian Coding |
| TI-14318 | 386,057 | 07/28/89 | Graphics Processor Nonconfined Address Calculation System |
| TI-14320 | 386,850 | 07/28/89 | Real Time and Slow Memory Access Mixed Bus Usage |
| TI-14399 | 387,479 | 07/28/89 | Graphics Coprocessor Having Imaging Capability |
| TI-14400 | 387,255 | 07/28/89 | Graphics Floating Point Coprocessor Having Stand-Alone Graphics Capability |
| TI-14401 | 387,243 | 07/28/89 | Graphics Floating Point Coprocessor Having Vector Mathematics Capability |
| TIL-13407 | 386,849 | 07/28/89 | Improvements in or Relating to Read-Only Memory |
| TIL-13494 | 387,266 | 07/28/89 | Method and Apparatus for Indicating When a Total in a Counter Reaches a Given Number |

This invention relates to comparing the total reached by a counter in counting pulses from a source with a given number and indicating when equality occurs.

In producing video displays from the output of computing apparatus it is often required to count picture elements along a line of the display as it is described and to indicate when the total reached is equal to a given number, in order that a change in brightness or colour can be implemented at some point, for example. Frequently several points of change are required along a line, so that it is impractical simply to count downwards from the given number because several counters would be needed, and therefore a single picture element counter is provided and the total in it is compared with a plurality of given numbers in order of size using a comparator. Static comparators can operate quickly and would be usable for displays of high resolution (say 1000 picture elements per line), but they require a relatively large area of semiconductor chip on which to be built because of the circuit-complexity of each stage. On the other hand, comparators using less complex dynamic MOS circuitry occupy only a relatively small area of semiconductor chip but suffer from a speed of operation which is much lower than that of a static comparator and which would be inadequate for use in conjunction with a high resolution display.

Digital data processors of other kinds also require comparators for comparing the totals in the counter with given numbers, and there may be processors calling for such a high speed of operation that a dynamic comparator is not fast enough.

It is an object of the present invention to alleviate at least partly the difficulty described above.

According to a first aspect of the present invention there is provided apparatus for indicating when the total in a counter counting pulses from a source reaches a given number, the total and the number each including a more significant group of digits and a less significant group of digits, the apparatus including a comparator for comparing the more significant group of digits of the total recorded in the counter with the more significant group of digits of the given number and producing an output signal when the groups of digits are equal to each other, a time delaying means connected to receive the output signal from the comparator and using as timing pulses the pulses from the source, decoding means responsive to the less significant digits of the given number to produce a gating signal on a corresponding one of a plurality of output conductors, the time delaying means being connected to the plurality of output conductors and being arranged to impose a time delay on the transmission of the output signal from the comparator to an output terminal depending on which of the output conductors carries the gating signal.

The time delaying means may include a multi-stage shift register to the first stage of which the output of the comparator is applied, and which uses the pulses from the source as shift pulses. A plurality of gating means operable by the gating signal may be provided respectively connected from the stages of the shift register to the output terminal, with the output conductors of the decoding means respectively connected to control inputs of the gating means.

The comparator may be given additional time to generate its output signal either by reducing by one or more the digit of least significance of the given number which is applied to it so as to provide advance warning of the approach of equality, or arranging that the counter generates earlier than the other digits the digit of least significance which it applies to the comparator.

The comparator may be constructed using dynamic MOS logic.

The counter may be a binary counter and the given number may be in binary code.

According to a second aspect of the present invention there is provided a method for indicating when the total in a counter counting pulses from a source reaches a given number, the method including the steps of comparing a group of more significant digits of the given number with a corresponding group of more significant digits of the total in the counter and producing an indication when the two groups of digits are of equal value, subjecting the production of the indication to a delay time equal to the time required for the source to produce pulses equal in number to the less significant digits of the given number remaining after the group of more significant digits has been subtracted from the given number, and producing an output in response to the delayed indication.

The indication itself may be delayed or the supply of digits from the counter for comparison with digits of the given number may be delayed. The delaying may be effected by a multi-stage shift register using as shift pulses the pulses from the source, with gating means responsive to the less significant digits of the given number for deriving a delayed signal from a selected stage of the shift register.

The group of more significant digits of the given number may be reduced by a predetermined amount, for example by one in the least significant place, before being compared with corresponding digits from the counter, so as to allow additional time for the indication to be produced following the comparison.

An example of apparatus for indicating when the total in a counter reaches a given number will now be described with reference to the accompanying drawings, of which:

FIG. 1 is a block diagram of the apparatus;

FIG. 2a is a circuit diagram of one stage of the comparator shown in FIG. 1;

FIG. 2b is an output amplifier providing the output for the final stage of the comparator;

FIG. 2c is an initial circuit providing an input signal for the first stage of the comparator;

Figure 3:
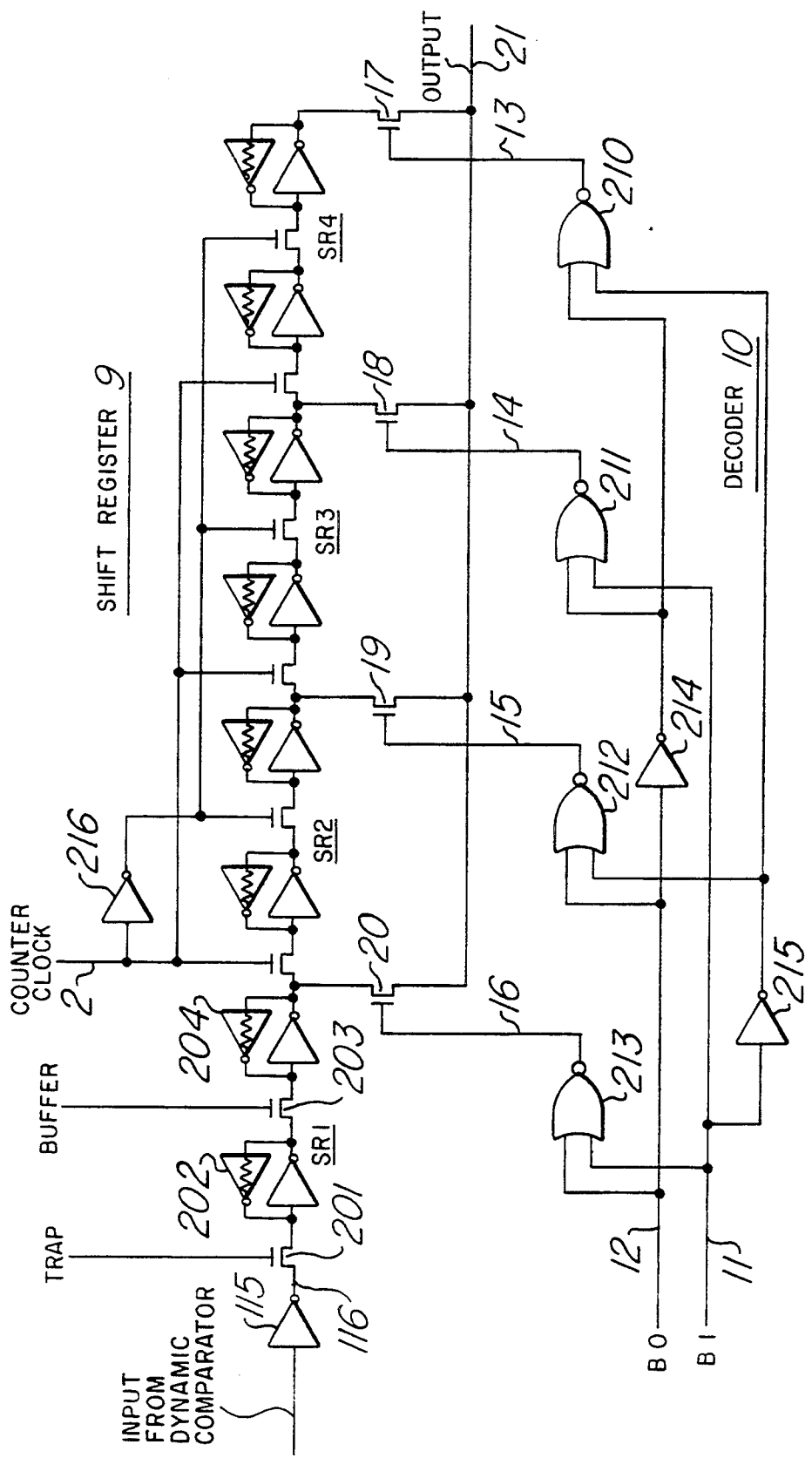
FIG. 3 is a circuit diagram of the shift register, decoder and gates of FIG. 1.

In the example of the apparatus shown in FIG. 1, a multi-stage binary counter 1 is connected to receive counter clock pulses via a conductor 2. A multi-stage binary comparator 3 is connected to all the stages of counter 1 except for the two stages of least significance. A register 4 stores a multi-bit binary number and has all but the two bits of least significance connected to corresponding inputs of the comparator 3 which serves to compare bits of the counter 1 with the corresponding bits of a given number stored in the register 4. The given number is entered for storage in the register 4 via a conductor 5. The conductor 2 is also connected to a divide-by-four circuit 6 which serves to produce clock pulses of one-quarter of the repetition frequency of the counter clock pulses on the conductor 2. The output pulses from the divide-by-four circuit 6 are conveyed by conductor 7 to operate the comparator 3. With each clock pulse applied to it the comparator 3 produces an output on conductor 8 indicating when the total in the counter 1 as represented by the bits applied to the comparator 3 reaches the given number stored in the register 4 except for its two digits of least significance. The conductor 8 is connected to the input of a first stage of SR1 of a four-stage shift register 9. The counter clock pulses on the conductor 2 are applied to the stages SR1, SR2, SR3 and SR4 of the shift register 9 as shift pulses and serve to step the bits entered into the first stage SR1 along the register 9. A two-bit decoder 10 is connected to receive the two bits of least significance of the given number stored in the register 4 by conductors 11 and 12. The decoder 10 has four output conductors 13, 14, 15 and 16 which are connected respectively to the control inputs of gates 17, 18, 19 and 20 connected from the stages SR4, SR3, SR2 and SR1 of the shift register 9 respectively to an output conductor 21.

The operation of the circuit of FIG. 1 will now be described. Ignoring for the moment the effect of the two least significant digits of the total recorded in the counter 1 and the given number, the comparator 3 operates in a conventional manner to compare the bits from the counter 1 with the corresponding bits of the given number stored in the register 4. The clock pulses on the conductor 7 cause the comparator 3 to effect a comparison of the two numbers with each change in the total in the counter 1 because the least significant of the stages of the counter 1 which are connected to the comparator 3, being the third stage of the counter, receives pulses at one-quarter of the frequency of the counter clock pulses via the first two stages of the counter 1. The outputs of these first two stages are not connected to any other component of the circuit. When the output from the comparator 3 on the conductor 8 undergoes a transition from 0 to 1, this indicates that the actual total reached by the counter 1 is equal to the given number as far as its more significant bits are concerned; but this does not take into account the two bits of least significance of the given number. If the comparator 3 were to receive the outputs of all the stages of the counter 1 and to compare them with all of the digits of the given number, then the output from the comparator 3 would occur at the correct time instant assuming that the comparator 3 could operate fast enough. But as the effect of the two least significant bits is not taken into account in producing the output on the conductor 8, it is necessary to delay this output by the time needed for the first two stages of the counter 1 to count counter clock pulses so as to become equal to the two bits of least significance of the given number. This delay is produced by means of the shift register 9 along which the 0 to 1 transition in the output of the comparator 3 on the conductor 8 is propagated by the counter clock pulses. The decoder 10 receives the two bits of least significance of the given number from the register 4 and produces an output signal on one of the conductors 13, 14, 15 and 16 depending on the combination of digits it receives from the register 4. If the two digits are both 0, then the conductor 16 is energised, opening the gate 20 so that the transition on the conductor 8 is transmitted to the output conductor 21 without additional delay. With the combination of bits 01, 10 or 11 from the register 4, the decoder 10 energises the conductors 15, 14 or 13, causing gate 19, 18 or 17 to be opened so as to impart a delay of one, two or three counter clock pulses on the transmission of the transition from the conductor 8 to the conductor 21.

It will be appreciated that the use of a shift register to provide delay as described above has the advantage that it can handle an uneven counter clock frequency without error. On the other hand, if the counter clock frequency is fixed, then it would be possible to replace the shift register by unclocked delaying elements.

It is not necessary for the delay controlled by the two bits of least significance of the given number to be applied to the output of the comparator 3; it could alternatively be applied to the supply of counter clock pulses, the start of counting by the counter 1 or the outputs of the stages of the counter 1, in which cases the output of the comparator 3 would be used directly.

Although the comparator 3 could be of any type, it is most likely that its speed of response will be too low for high counter clock frequency so that it is necessary to use the circuit shown in FIG. 1 if it is constructed as a dynamic MOS logic circuit. For example, if the comparator is of a static logic design, as equality of the two numbers is approached, only the lower significance bits become critical in determining the output of the comparator. With a dynamic design, however, the status of all of the stages of the comparator have to be examined at each clock pulse, which means that the response time of the comparator as a whole is determined by the speed of propagation of a signal along all stages of the comparator and the greater the number of bits in the comparator the lower will be the maximum clock frequency that it can use. On the other hand, the use of dynamic MOS circuitry has the advantage over a static logic circuit in that it is much simpler and can be implemented on a smaller area of semiconductor wafer.

FIG. 2a shows in detail the circuit of one stage of a comparator constructed using dynamic MOS logic together with an initial input circuit (FIG. 2c) and an output amplifier (FIG. 2b). In FIG. 2a, the nth bit, An, of the totaling counter 1, is applied by a conductor 101 to the gate electrodes of transistors 102 and 103. The nth bit, Bn, of the given number, is applied by a conductor 104 through an inverter 105 to the gates of transistors 106 and 107. The stages of the comparator are connected in a chain and the output of stage n-1, OUTn-1, is applied by a conductor 108 through the transistors 102 and 106 connected in parallel to a conductor 109 on which the output of the stage n, OUTn, appears. The conductor 109 is connected through the transistors 103 and 107 in series through a further transistor 110 to ground. The gate of the transistor 110 is connected to receive the clock signal, CLK, of the comparator. The conductor 109 is precharged in response to the clock signal to a supply voltage VCC through a transistor 111 to the gate of which the clock signal, CLK, is applied. The transistors 102, 103, 106, 107 and 110 are all n-channel MOS transistors, whilst the transistor 111 is a p-channel MOS transistor, which means that the transistor 111 is conducting to precharge the conductor 109 when the clock signal is low.

FIG. 2c shows an initial circuit consisting of an n-channel MOS transistor 112 and a p-channel MOS transistor 113 connected in series between ground and the supply rail VCC which is used to produce an input signal to the first stage of the counter on a conductor 114. This signal is denoted OUTI.

The output of the final stage of the comparator, OUTN, is applied to the input of an inverter 115 as shown in FIG. 2b which produces the output of the comparator on a conductor 116 which is the same as the conductor 8 of FIG. 1.

The operation of the comparator circuit is such that it produces a logic 1 on the conductor 116 if the N-bit binary number A is greater than or equal to the N-bit number B. At equality, when An=Bn for all N stages of the comparator, one of the transistors 102 and 106 will be conducting so as to connect the conductor 108 to the conductor 109, and one of the transistors 103 and 107 will be non-conducting so as to isolate the conductor 109 from ground when the transistor 110 is turned on by the clock signal. This operation of the transistors 102, 103, 106 and 107 has the effect of passing the decision as to whether or not the numbers A and B are equal along the chain of stages from the most significant towards the least significant. If all pairs of corresponding digits are equal, a low signal will be passed from the conductor 114 following the switching of the transistor 112 by the clock signal, through all the stages to the input of the inverter 115, thus causing a high signal to be produced on the conductor 116. If the bit An is 1 and the corresponding bit Bn is 0, then both transistors 103 and 107 are conducting so that a low is produced as an output from that stage to the next more significant stage. This means that if the number A is larger than the number B so that the number A is a 1 B and the number B is 0 in the most significant bit position where the bits of numbers A and B are not the same, then the low output from that stage will be propagated to the output and appear as a high on the conductor 116. On the other hand, if the number B is larger than the number A, then transistors 102, 103, 106 and 107 will all be non-conducting where the number B has a 1 and the number A has a 0. This means that the high produced on the conductor 109 by the precharging will not be discharged and will be propagated forward and produce a low on the conductor 116.

FIG. 3 shows a circuit of the shift register 9, the decoder 10 and the gates 17, 18, 19 and 20 of FIG. 1. The same reference numerals are used in FIG. 3 as are used in FIG. 1. The output inverter 115 of the dynamic comparator 3 is also shown in FIG. 3, and the conductor 116 from its output is connected through a transistor 201 to the input of a first bistable circuit 202 the output of which is connected through a second transistor 203 to the input of a second bistable circuit 204. The transistors 201 and 203 and the bistable circuits 202 and 204 together form the first stage SR1 of the shift register 9. The other stages SR2, SR3 and SR4 of the shift register 9 are of the same construction. The gates 17, 18, 19 and 20 are formed by single series-connected transistors and are connected from the outputs of the stages SR4, SR3, SR2 and SR1 respectively to the output conductor 21. The decoder 10 receives the bits B0, B1, the least significant two bits of the given number B stored in the register 4 of FIG. 1, along conductors 12 and 13 respectively. The decoder 10 includes four two-input NOR-gates 210, 211, 212 and 213 and two inverters 214 and 215. The conductor 12 is connected directly to an input of each of the NOR-gates 212 and 213 and through the inverter 214 to an input of each of the NOR-gates 210 and 211. The conductor 11 is connected directly to an input of each of the NOR-gates 211 and 213 and through the inverter 215 to an input of each of the NOR-gates 210 and 212. The outputs of the NOR-gates 210, 211, 212 and 213 are respectively connected by the conductors 13, 14, 15 and 16 to the gates of transistors forming the gates 17, 18, 19 and 20 respectively.

Figure 4:
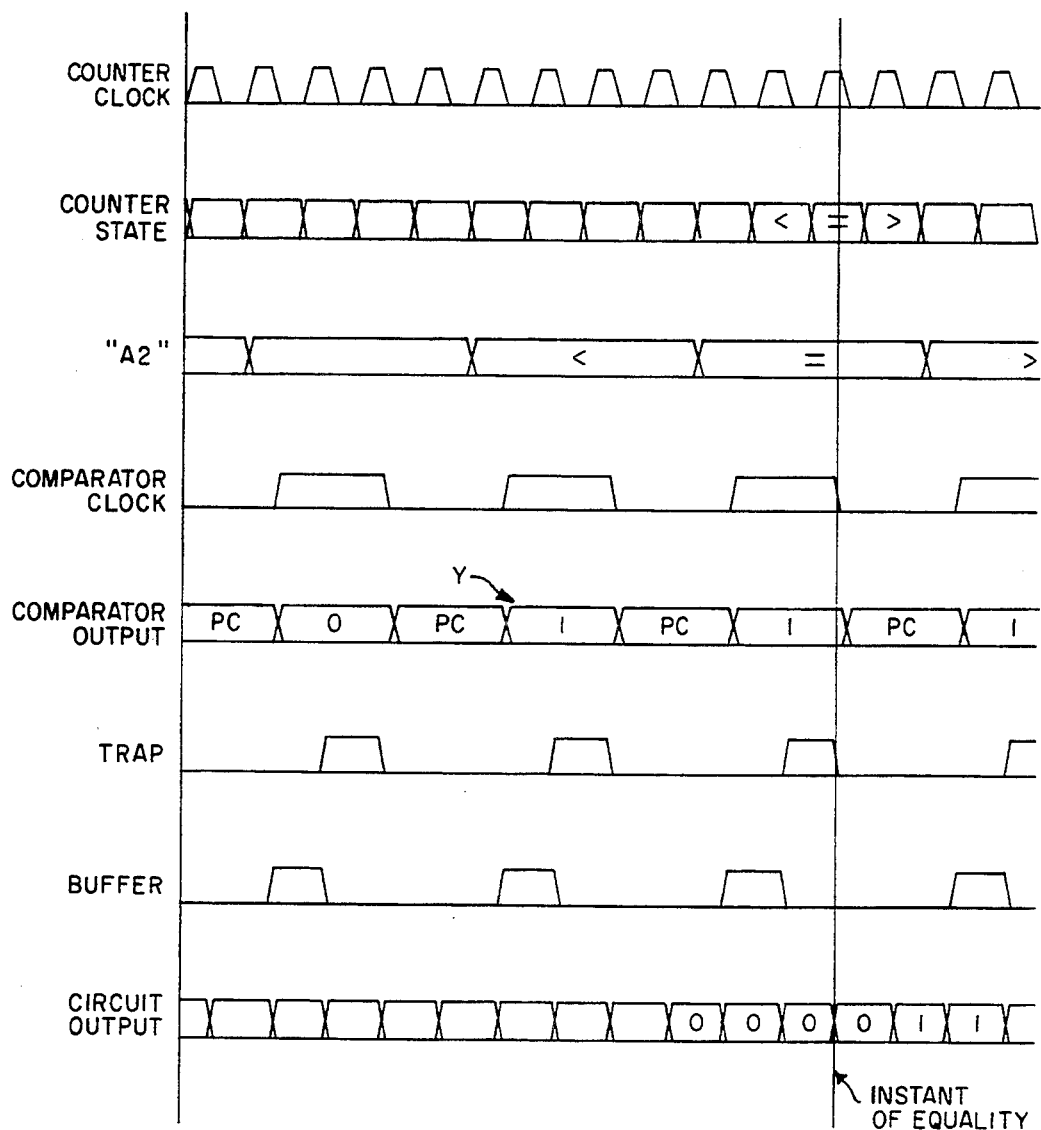
FIG. 4 shows the waveforms of signals in the apparatus.

The shift register stages SR1, SR2, SR3 and SR4 each contain two bistables, so that the shift register stages have two storage elements per bit and are shifted by two phase shift pulses. The counter clock pulses on the conductor 2 form one phase of the shift pulses applied to the stages SR2, SR3 and SR4, and the second phase shift pulses are provided by an inverter 216 connected to the conductor 2 for inverting the counter clock pulses. The first shift register stage SR1 uses as its two phase shift pulses TRAP pulses and BUFFER pulses, respectively applied to the gates of the transistors 201 and 203. The timing of these pulses is shown in FIG. 4. The TRAP pulses overlap the second halves of the clock pulses applied to the comparator 3 to enable the voltage on the output conductor 116 of the comparator to settle down after it has been evaluated before it is used to establish the state of the bistable 202. The buffer pulses are of the same repetition frequency as the TRAP pulses and serve to transfer the state stored in the bistable 202 into the bistable 204. The delay in establishing the state in the bistable 204 following the output of the comparator 3 on conductor 116 is taken into account in the generation of the output signal. The shift register stages SR2, SR3 and SR4 impose the additional one, two or three, counter clock pulse periods as described above.

As explained above, when the output from the comparator 3 first goes high, indicating that equality between the more significant bits of the total A in the counter 1 and the given number B in the register 4 has been reached, the least significant two bits of the total A are both zero. If the least significant two bits of the given number B are also both zero, the high output of the comparator should be used without delay. In order that this shall work correctly, and that the other delays required when the less significant two bits of the given number 13 are not both zero shall be correct, the output from the comparator must appear at the output of the first stage SR1 of the shift register at the right time. The operation of the TRAP and BUFFER pulses in shifting the output of the comparator into the stage SR1 imposes some delay and the operation of the comparator itself introduces some additional delay. The effect of this delay is nullified by subtracting one from the number represented by the group of more significant bits of the given number B, that is to say from the number applied by the register 4 to inputs of the comparator 3. This reduction in the given number means that the comparator 3 produces its high output indicating equality four counter clock pulses early. The waveforms shown in FIG. 4 illustrate the comparator operating in this way and show how the TRAP and BUFFER pulses provide the right delay so that the comparator output appears at the output of He stage SR1 at exactly the right time.

In FIG. 4, all the waveforms are shown on the same time scale and marked on the waveforms are the symbols: $<$, $=$, $>$, 0, 1, and PC. These have the following meanings:

"$<$" "$=$" and "$>$" mean that the total in the counter or the number A2 represented by all but the two bits of least significance of the total in the counter is less than, equal to, and greater than the given number or the corresponding part of that number.

"0" and "1" are the alternative outputs produced by the comparator and the circuit as a whole. "1" indicates equality of the two numbers. "PC" means precharge.

The line X denotes the instant of equality when the total in the counter becomes equal to the given number. As indicated above, the number in the register 4 is equal to the given number minus 4, i.e. 1 in the third bit place from the least significant end. The comparator is therefore able to detect the approach of equality at time Y, allowing the TRAP and BUFFER pulses to shift the "1" state into SR1 so that the circuit output is produced at the correct time, at the falling edge of the counter clock pulse bringing the counter total to equality with the given number.

As an alternative to reducing the number stored in the register 4, the additional time for the comparator to respond may be provided by speeding up the response of the third counter stage, the stage of least significance connected to the comparator. As the additional time which can be provided in this way is less than that provided in the manner described above, it will be necessary to modify the timing or construction of the first shift register stage SR1, or even omit that stage altogether.

The delaying of the production of the output signal from the comparator by a time depending on the least significant two bits of the given number may alternatively be effected by delaying the application of the counter clock signals to the counter, or the application of signals derived from the counter clock signals to the stages of the counter which are connected to the comparator.

More or fewer than two bits of the given number may be used to delay the production of the output signal from the comparator with appropriate adjustment of the number of delaying (shift register) stages.

What we claim is:

1. A video system comprising:
   a video display;
   a computing apparatus having an output to said video display and including:
   a first register operative to hold a first data word;
   a counter having a count register operative to hold count data, said counter operative to increment the count data;
   a comparator connected to said first register and to said count register operative to compare the count data with the first data word to generate an output signal;
   an output register connected to said comparator operative to receive the output signal from said comparator; and
   a decoder connected to said first register operative to decode data from the first data word for controlling said output register.

2. The video system of claim 1, wherein most significant bits of said first register and said count register are compared for generating the output signal.

3. The video system of claim 2, wherein least significant bits of said first register are decoded by said decoder.

4. The video system of claim 1, wherein said output register comprises a plurality of shift registers each having a register output and a clock input for receiving clock pulses.

5. The video system of claim 4, wherein each register output comprises an output gate connected to an output line operative to receive a control signal from said decoder to provide the output signal from said comparator to the output line.

6. A graphics processing system comprising:

a host computer;

a memory connected to said host computer operative to hold computation data in a plurality of memory locations; and a graphics processor connected to said host computer operative to perform operations on graphics data, said graphics processor comprising:

a first register operative to hold a first data word;

a counter-having a count register operative to hold count data, said counter operative to increment the count data;

a comparator connected to said first register and to said counter register operative to compare the count data with the first data word to generate an output signal;

an output register connected to said comparator operative to receive the output signal from said comparator; and a decoder connected to said first register operative to decode data from the first data word for controlling said output register.

7. The graphics processing system of claim 6, wherein least significant bits of said first register are decoded by said decoder.

8. A graphics processing apparatus comprising:

external terminals operative to provide communication for data and control signals;

a video memory operative to hold graphics data in a plurality of memory locations; and a video processor connected to said video memory operative to perform operations on graphics data, said video processor comprising:

a first register operative to hold a first data word;

a counter having a count register operative to hold count data, said counter operative to increment the count data;

a comparator connected to said first register and to said count register operative to compare the count data with the first data word to generate an output signal;

an output register connected to said comparator operative to receive the output signal from said comparator; and a decoder connected to said first register operative to decode data from the first data word for controlling said output register.

9. The graphics processing apparatus of claim 8, wherein least significant bits of said first register are decoded by said decoder.

10. The graphics processing apparatus of claim 8, further comprising a palette circuit connected to said video memory.

* * * * *